(12) United States Patent
Houle

(10) Patent No.: US 6,839,366 B1
(45) Date of Patent: Jan. 4, 2005

(54) LASER FREQUENCY CONTROL USING DITHERED CONTROL SIGNAL

(75) Inventor: Alain Houle, Petaluma, CA (US)

(73) Assignee: Cisco Technology, Inc., San Jose, CA (US)

( * ) Notice: Subject to any disclaimer, the term of this patent is extended or adjusted under 35 U.S.C. 154(b) by 35 days.

(21) Appl. No.: 09/942,459

(22) Filed: Aug. 29, 2001

(51) Int. Cl.[7] .................................................. H01S 3/13
(52) U.S. Cl. ..................... 372/32; 372/22; 372/29.01; 372/29.14; 372/29.015; 372/29.02
(58) Field of Search ............. 372/32, 22, 29.01–29.02, 372/29.14–29.15, 29.015, 102

(56) References Cited

U.S. PATENT DOCUMENTS

| | | | | |
|---|---|---|---|---|
| 4,801,206 A | * | 1/1989 | Benoist ........................ 356/459 |
| 5,077,746 A | * | 12/1991 | Ewart ............................. 372/19 |
| 5,262,843 A | * | 11/1993 | Sugarbaker et al. ......... 356/464 |
| 5,796,535 A | * | 8/1998 | Tuttle et al. ..................... 360/51 |
| 5,828,689 A | | 10/1998 | Epworth ........................ 372/98 |
| 5,909,333 A | * | 6/1999 | Best et al. ....................... 360/51 |
| 5,973,309 A | * | 10/1999 | Livingston ................. 250/203.1 |
| 6,088,107 A | * | 7/2000 | Livingston .................... 356/623 |
| 6,205,159 B1 | * | 3/2001 | Sesko et al. .................... 372/20 |
| 6,222,861 B1 | | 4/2001 | Kuo et al. ........................ 372/20 |
| 6,233,263 B1 | * | 5/2001 | Chang-Hasnain et al. ..... 372/32 |
| 6,239,892 B1 | * | 5/2001 | Davidson ..................... 398/154 |
| 6,337,939 B1 | * | 1/2002 | Aspell et al. ................... 385/37 |
| 6,353,623 B1 | * | 3/2002 | Munks et al. .................. 372/20 |
| 6,373,515 B1 | * | 4/2002 | Morrison ..................... 347/249 |
| 6,437,889 B2 | * | 8/2002 | Davidson ...................... 398/98 |
| 6,526,079 B1 | * | 2/2003 | Watterson et al. ............ 372/32 |

* cited by examiner

Primary Examiner—Minsun Oh Harvey
Assistant Examiner—Delma R. Flores-Ruiz
(74) Attorney, Agent, or Firm—Ritter, Lang & Kaplan LLP

(57) ABSTRACT

A dithering signal is superimposed on a laser frequency control signal. In this way, laser frequency control may be achieved by employing measurements from a single photodetector. By sampling synchronously to the dithering signal, it is possible to generate both the magnitude end sign of the current frequency error based on the output of a single photodetector. This reduces the number of components required to generate an optical signal and is particularly advantageous in WDM systems where laser frequency control components may be duplicated over a large number of channels.

24 Claims, 10 Drawing Sheets

LASER FREQUENCY CONTROL USING DITHERED CONTROL SIGNAL

BACKGROUND OF THE INVENTION

The present invention relates to lasers, and more particularly to systems and methods for controlling laser output frequency.

Fiber optic technology is finding increasing application in carrying growing amounts of data communication traffic including traffic related to operation of the Internet. With the growing use of the Internet to carry voice and video communications, the need for greater bandwidth will only expand further. Fiber optic technology offers the potential for vast increases in available bandwidth. As the cost of optical components decreases, fiber optic technology is spreading from the backbone to metropolitan networks and even to residential and business access lines.

Typically, an optical signal to be carried across a fiber is generated by a coherent light source, i.e., a laser. Amplitude modulation of a laser output is used to convey payload data down the fiber. This modulation may be applied either by direct variation of an output amplitude control signal fed to the laser or by use of a modulation component that processes a laser output.

There are limits, however, to the data rate that can be comfortably accommodated by a single optical signal as would be generated by a laser. For example, very high data rates, e.g., on the order of 40 Gbps or higher may be difficult to process electronically prior to modulation of a light signal. A technique for increasing the data carrying capacity of a fiber without increasing the modulation rate on a single optical signal is wavelength division multiplexing (WDM). In WDM, multiple optical signals having different wavelengths and each generated by a different laser are transmitted concurrently over a common optical fiber thus expanding the available data carrying capacity and providing other advantages in implementation. One current trend in WDM technology is closer spacing of multiple optical signals in the frequency domain. This allows for a greater payload data rate to be accommodated within a segment of the optical spectrum sufficiently narrow to lie wholly within the optimal communication band of the fiber optic link.

However, as the data rate carried by each individual optical signal increases, the occupied bandwidth also increases. The sidebands of adjacent optical signals may be very close to one another when the lasers operate at their nominal frequencies. Due to these close spacings, laser frequency drift cannot be tolerated. Furthermore, receiver components such as demultiplexers will assume that the optical signals remain close to their nominal positions in the frequency domain. Accordingly, there is a need to measure and control the frequency of each laser to avoid the possibility of one wavelength component drifting to the point that it overlaps another and also to assure proper receiver operation.

In a typical laser frequency control scheme, a four-port coupler is arranged so at to receive optical energy from a laser output and tap off a small portion to be fed through a first frequency-selective filter to a first photodetector. The response of the first frequency-selective filter has a slope such that the photodetector output signal increases with increasing laser frequency.

Signal energy that does not pass through the first frequency-selective filter reflects back into the coupler where it is directed to a second frequency-selective filter to which a second photodetector is connected. The second frequency-selective filter has a frequency response with a slope reversed compared to that of the first frequency-selective filter. A ratio of the outputs of the two photodetectors indicates the current laser output frequency and from this an error signal may be formed for frequency control.

A drawback of this scheme is that two photodiodes and two filters are required for each laser. As the number of channels in WDM systems continues to increase, it is desirable to minimize the optical components required to generate the signal on each channel. This includes the components for laser frequency control.

SUMMARY OF THE INVENTION

By virtue of one embodiment of the present invention, a dithering signal is superimposed on a laser frequency control signal. In this way, laser frequency control may be achieved by employing measurements from a single photodetector. By sampling synchronously to the dithering signal, it is possible to generate both the magnitude and sign of the current frequency error based on the output of a single photodetector, and to control the laser frequency based on this error. This reduces the number of components required to generate an optical signal and is particularly advantageous in WDM systems where laser frequency control components may be duplicated over a large number of channels.

According to the first aspect of the present invention, a method for controlling an output frequency of a laser includes: passing optical energy from an output of the laser to an optical component having a frequency-selective response characteristic, measuring response of the optical component having a frequency-selective response characteristic to the optical energy from the laser output using exactly one photodetector, and controlling the laser output frequency based on the measured response and not on measurements from photodetectors other than the exactly one photodetector.

According to a second aspect of the present invention, a method for controlling an output frequency of a laser includes: passing optical energy from an output of the laser to an optical component having a frequency-selective response characteristic, measuring response of the optical component having the frequency-selective response characteristic to the optical energy from the laser output, generating a dithering signal to dither the output frequency of the laser, and controlling the laser output frequency based on the measured response as influenced by the dithering signal.

Further understanding of the nature and advantages of the inventions herein may be realized by reference to the remaining portions of the specification and the attached drawings.

DESCRIPTION OF SPECIFIC EMBODIMENTS

One embodiment of the present invention provides systems and methods for controlling the frequency of a laser. Applications include optical communication systems where a laser is used to generate an optical signal that will carry payload data via an optical fiber. In one particular application, multiple lasers are used to generate multiple optical signals that are multiplexed together in the frequency domain onto the same optical fiber. The frequency control system described herein may be used to assure adherence to a band plan that specifies the exact desired locations of the multiple optical signals in the frequency domain. The present invention, is not, however, limited to communications applications and may be employed in any suitable application. For example, laser frequency may be controlled according to the present invention in, e.g., medical applications, industrial applications, etc.

Figure 1:
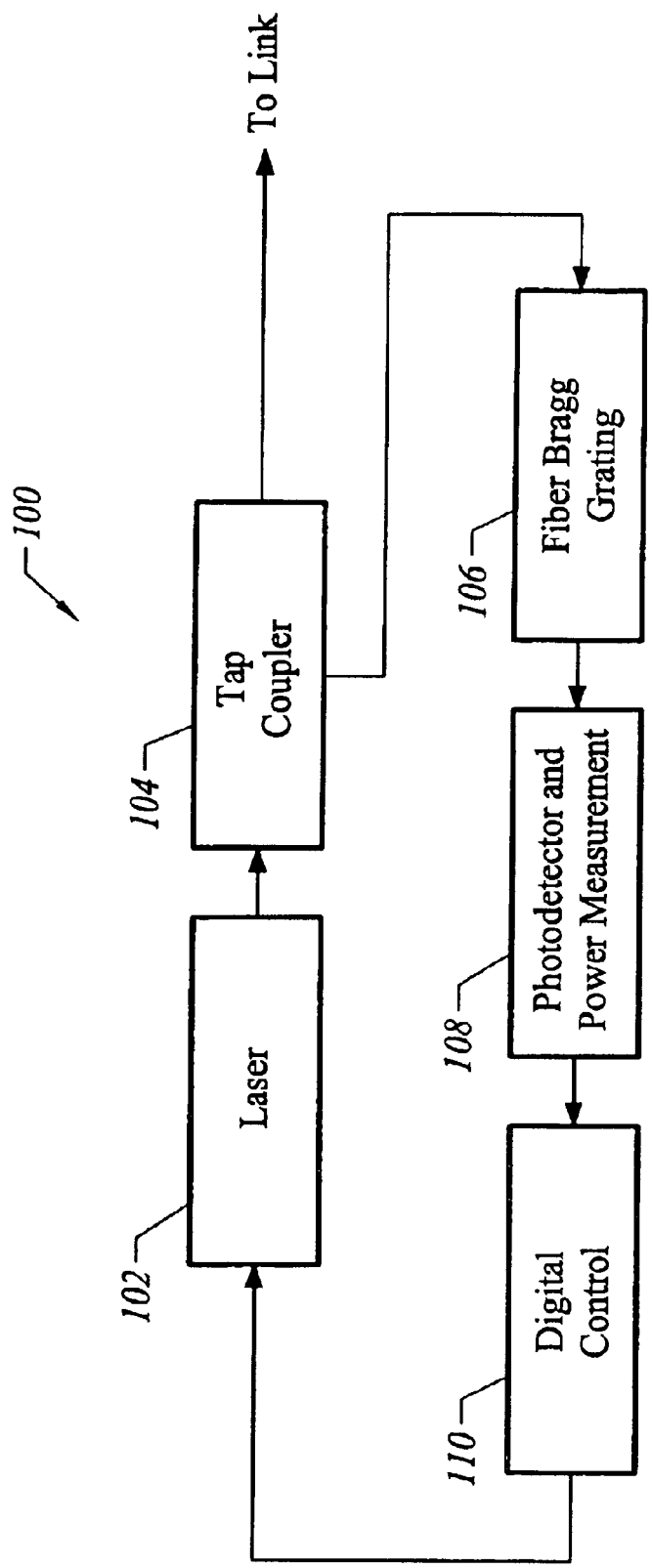
FIG. 1 depicts a laser frequency control system according to one embodiment of the present invention.

FIG. 1 depicts a laser frequency control system 100 according to one embodiment of the present invention. A laser 102 outputs coherent light at a preselected frequency that it is regulated to its desired value by the operation of control system 100. The optical energy output by laser 102 encounters a tap coupler 104. Most of the optical energy incident on tap coupler 104 (e.g., 99%) is sent on to the optical communication link. A modulator (not shown) is preferably placed after tap coupler 104 to modulate data onto the optical signal. The remaining portion of the optical energy output by laser 102 (e.g., 1%) is tapped off and passed to a fiber Bragg grating 106. Fiber Bragg grating 106 operates as a notch filter where the notch frequency is set to be the desired value for the laser output. Fiber Bragg grating 106 transmits the minimum amount of optical energy and reflects the maximum amount of optical energy at the notch frequency. Any optical component with a suitable transfer function may substitute for fiber Bragg grating 106.

A photodetector and power measurement block 108 measures the power level of the optical energy transmitted through fiber Bragg grating 106 and generates an analog signal proportional to this power level. Block 108 preferably incorporates a single photodetector and analog conditioning electronics as known in the art. A digital control block 110 receives the analog power signal and in response generates a control signal that controls the output frequency of laser 102. Laser 102 may, in one example, be frequency controlled by way of controlling its operating temperature using an electrical temperature control. Digital control block 110 may be implemented as, e.g., a custom integrated circuit, an FPGA, an ASIC, software executing on a general-purpose microprocessor or microcontroller, or any combination thereof.

Figure 2:
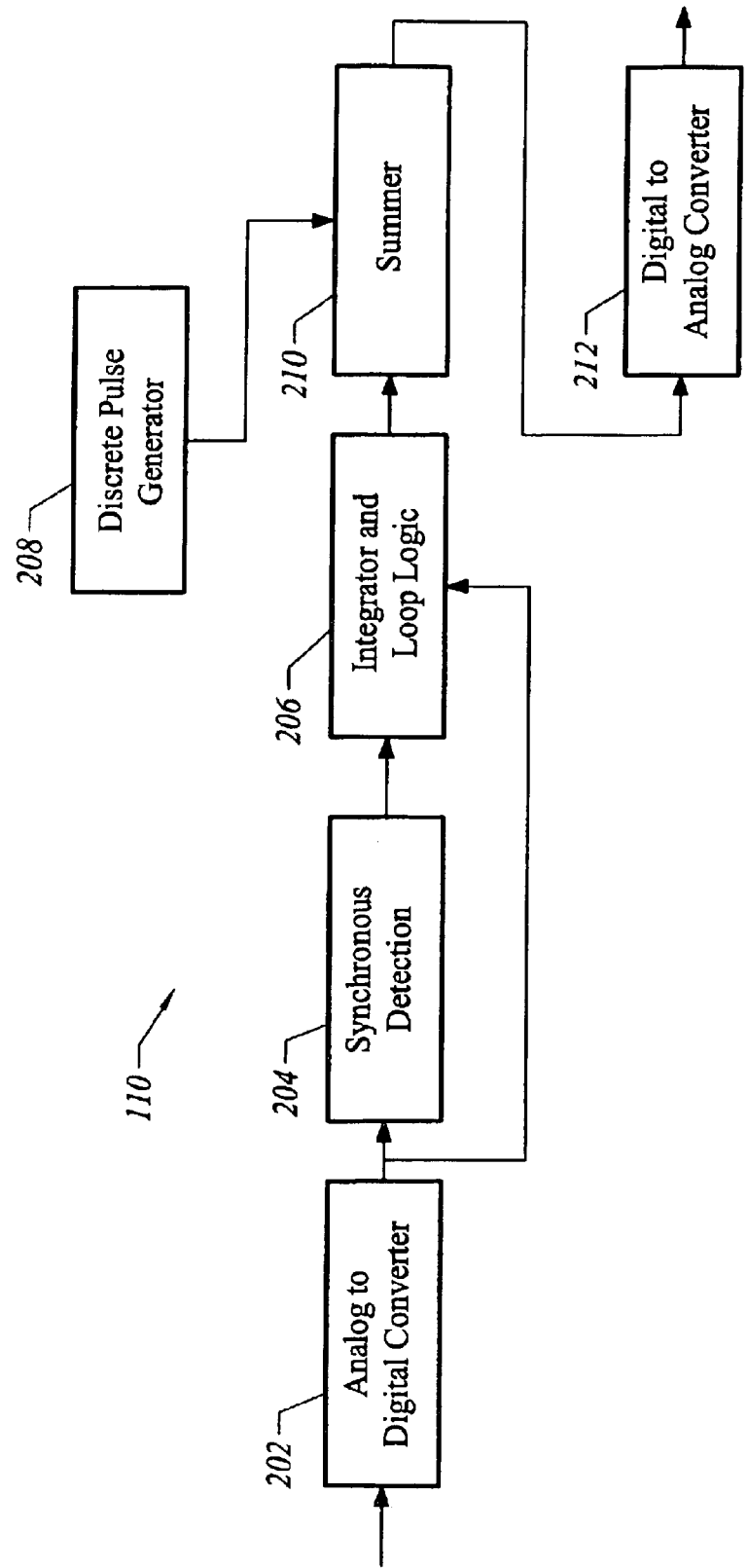
FIG. 2 depicts details of a digital control block according to one embodiment of the present invention.

FIG. 2 depicts details of digital control block 110 according to one embodiment of the present invention. The analog power signal is input to an analog to digital converter 202 that develops a digital output word reflecting the analog signal value. In one embodiment, the analog signal is sampled every 50 ms and the output digital word is 8 bits wide A synchronous detection block 204 receives the digital power level from analog to digital converter 202 and estimates an error between the current laser frequency and the desired laser frequency. Details of synchronous detection block 204 will be explained with reference to FIG. 3.

An integrator and loop logic block 206 monitors and integrates the error signal to develop a control signal used to control laser output frequency in a tracking mode employed when laser frequency deviation is relatively small. When the frequency deviation is relatively large, integrator and loop logic block 206 sweeps the laser frequency back and forth until the deviation becomes sufficiently small so that the tracking mode may be re-entered. Details of integrator and loop logic block 206 will be described with reference to FIG. 4.

The control signal output by digital control block 110 includes the output of integrator and loop logic block 206 and a dithering signal generated by a discrete pulse generator 208. The dithering signal output by discrete pulse generator 208 is, in one embodiment, a square wave having a period of ten seconds and a 50% duty cycle. As will be explained below, the inclusion of this dithering signal allows synchronous detection block 204 to determine not only the magnitude of the current laser frequency deviation from its desired value but also its sign without the use of two photodetectors as required by prior art techniques. A summer 210 adds the dithering signal to the integrated error signal to form a digital control signal. In one embodiment, the dithering signal is scaled so as to induce a +/−2.5 GHz fluctuation in laser frequency.

The output of summer 210 is input to a digital to analog converter 212. In one embodiment, the clock rate of converter 212 is 20 Hz. The output of digital to analog converter 212 may then be appropriately scaled and used to control the temperature of laser 102 and thereby its output frequency.

Figure 3:
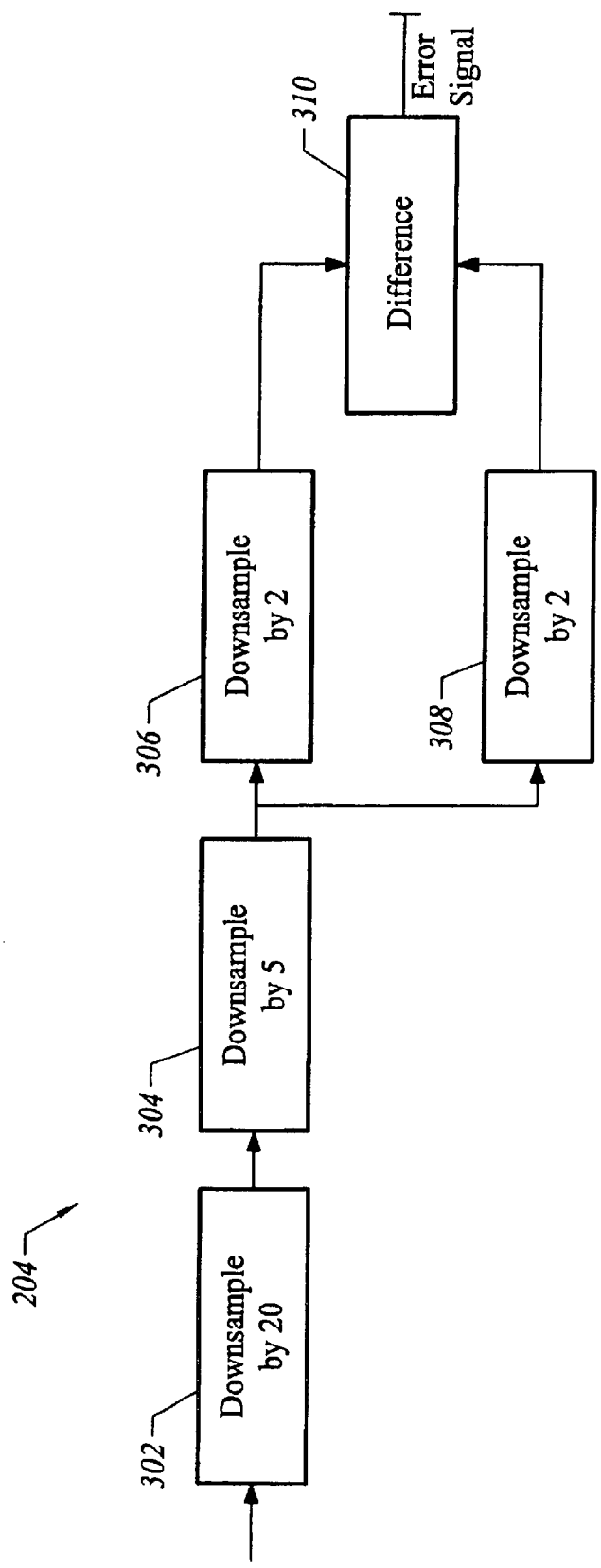
FIG. 3 depicts details of a synchronous detection block for generating a frequency error signal according to one embodiment of the present invention.

FIG. 3 depicts details of synchronous detection block 204 according to one embodiment of the present invention. A first downsampler 302 downsamples by a factor of 20, extracting every $20^{th}$ sample from the input sample stream. The sampling rate at the output block 302 is therefore 1 Hz. The output of downsampler 302 is input to a second downsampler 304 that downsamples again by a factor of 5 The sampling period of the output of second downsampler 304 is thus five seconds corresponding to a sampling rate of 0.2 Hz. There are therefore two samples output by second downsampler 304 for each cycle of the dithering signal.

The samples of the output of second downsampler 304 are synchronized in time to the dithering signal generated by discrete pulse generator 208 such that each cycle of the dithering signal has two associated samples, one aligned to the "high" phase of the square wave and the other sample aligned to the "low" phase of the square wave. A third downsampler 306 and a fourth downsampler 308 both downsample by two. Third downsanpler 306 and fourth downsampler 308 select alternating samples from the output of second downsampler 304 such that third downsampler 306 always selects a sample aligned to the "low" phase of the dithering square wave and fourth downsampler 308 always selects a sample aligned to the "high" phase of the dithering square wave. A difference block 310 outputs the difference between the current outputs of third downsampler 306 and fourth downsampler 308. Difference block 310 outputs one sample for each dithering signal cycle. The output of difference block 310 is a digital error signal.

Figure 5:
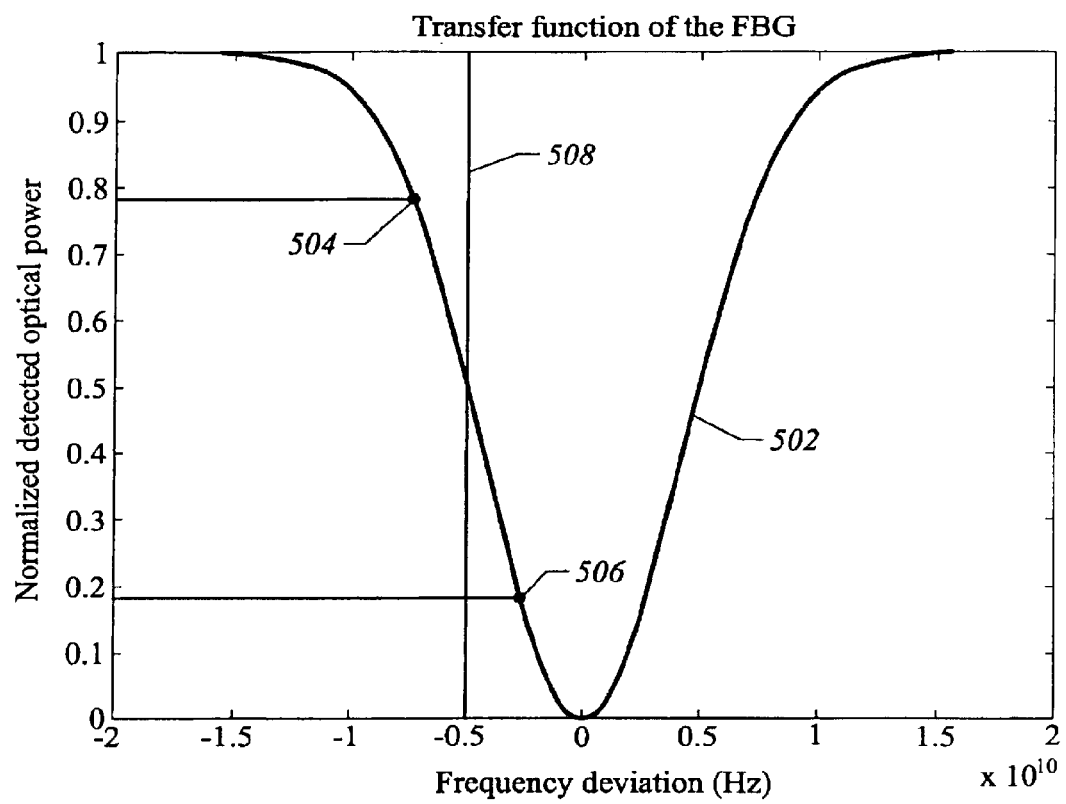
FIG. 5 graphically depicts the relationship between laser output frequency and the transfer function of a fiber Bragg grating when the laser frequency is 5 GHz away from a desired value according to one embodiment of the present invention.

The operation of synchronous detection block 204 will be described in further detail with reference to specific examples. FIG. 5 depicts the current and desired laser frequencies in relation to a plot of a response 502 of fiber Bragg grating 106. The current frequency is 5 GHz less than the desired frequency. Response 502 has been generated by plotting the power output of grating 106 as a function of laser frequency. As can be seen, response 502 has a notch shape and the center of the notch corresponds to the desired output frequency of the laser. A first point 504 shows the laser frequency when the dithering signal is at its minimum value while a second point 506 shows a laser frequency when the dithering signal is at a maximum value. A line 508 midway between points 504 and 506 in the frequency domain illustrates the frequency that would be maintained in the absence of the dithering signal.

Synchronous detection block 204 determines the sign of the frequency deviation based on whether the fluctuation in the output power of fiber Bragg grating 106 follows the dithering signal or is 180 degrees out of phase with the dithering signal. If the measured power level is higher when the dithering signal is in its "high" phase, then the frequency deviation is positive. If, however, like in FIG. 5, the measured power is lower when the dithering signal is in its "high" phase, then the frequency deviation is negative.

Figure 6A:
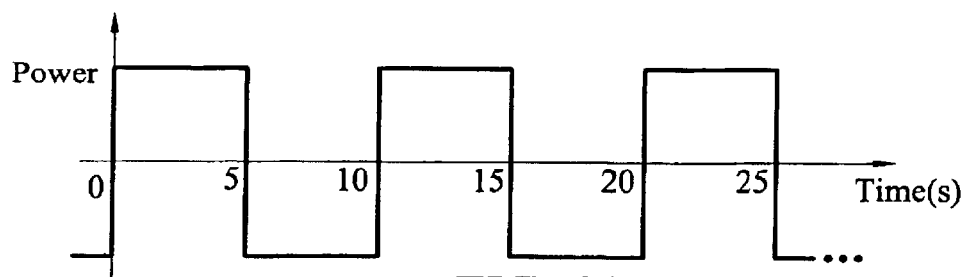
FIGS. 6A–6E depict intermediate signals generated in response to the laser frequency deviation depicted in FIG. 5 according to one embodiment of the present invention.
Figure 6B:
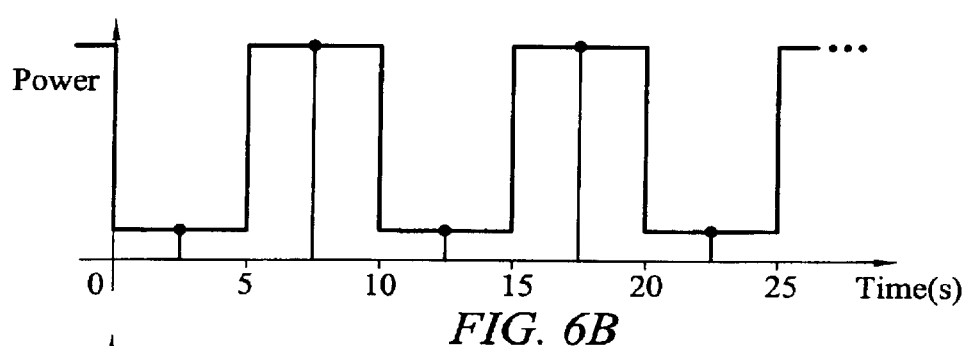
Figure 6C:
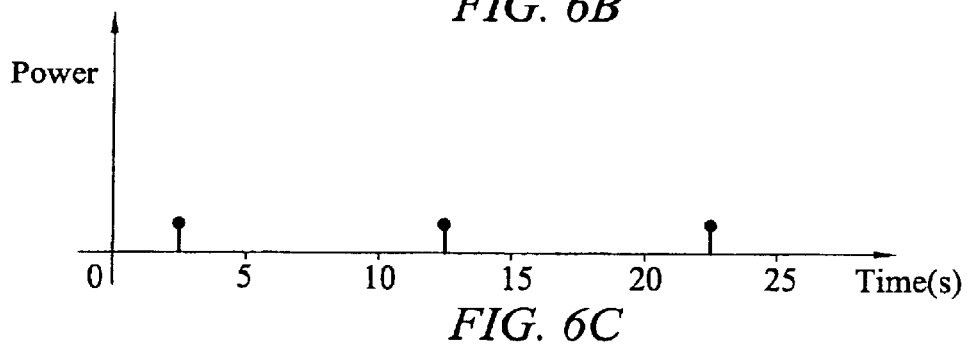
Figure 6D:
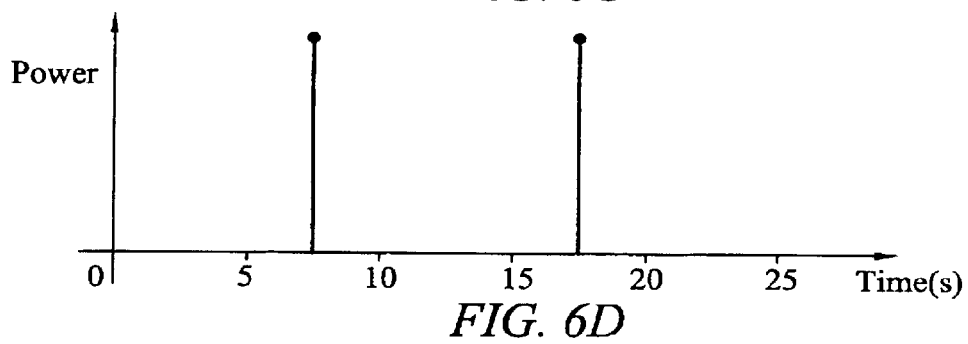
Figure 6E:
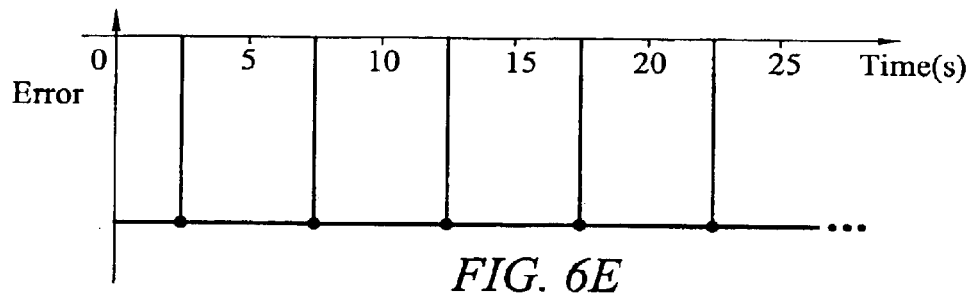

FIG. 6A depicts the variation in laser frequency over time in the situation of FIG. 5. FIG. 6B depicts the variation in optical power output by fiber Bragg grating 106 with samples output by second downsampler 304 marked by vertical lines. FIG. 6C depicts the samples output by fourth downsampler 308 while FIG. 6D depicts the samples output by third downsampler 306. FIG. 6E depicts the differences determined by difference block 310. Since the signal samples associated with the "low" phase of the dithering signal are higher than the signal samples associated with the "high" phase, the difference signal, which is a digital error signal, possesses a negative value indicating a negative frequency deviation as is the case in FIG. 5.

Figure 7:
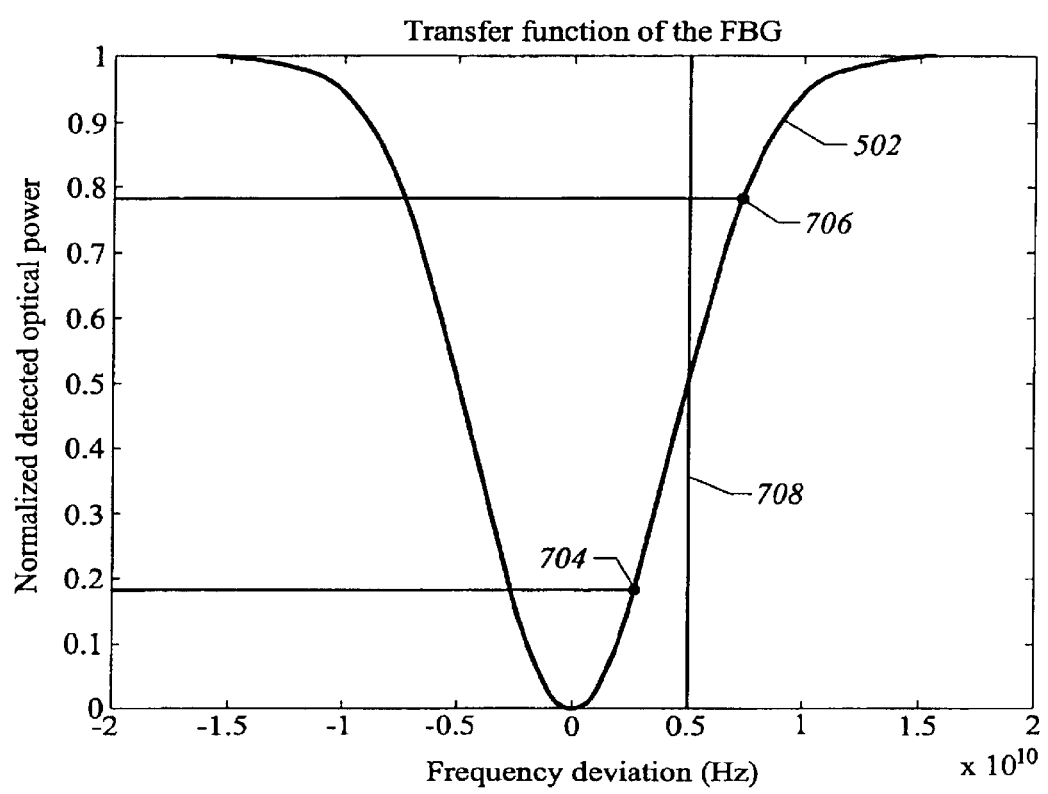
FIG. 7 graphically depicts the relationship between laser output frequency and the frequency response of a fiber Bragg grating where the laser frequency is 5 GHz above a desired value according to one embodiment of the present invention.

FIG. 7 is similar to FIG. 5 except that a positive frequency deviation is depicted. A first point 704 shows laser frequency during the "low" phase of the dithering signal and a second point 706 shows the laser frequency during the "high" phase of the dithering signal. A line 708 illustrates the +5 GHz deviation that would be observed in the absence of the induced dithering signal.

Figure 8A:
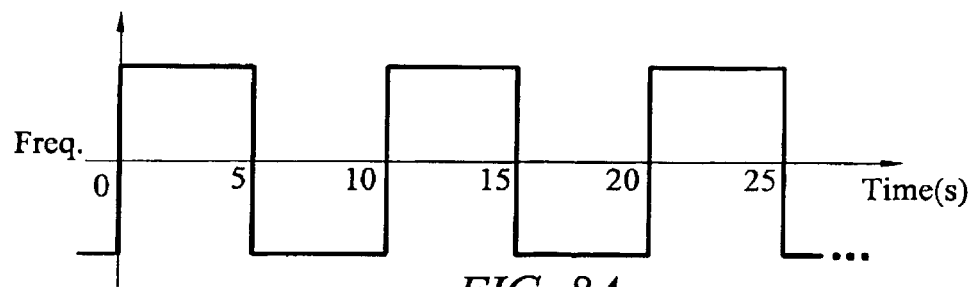
FIGS. 8A–8E depict intermediate signals generated in response to the laser frequency deviation depicted in FIG. 7 according to one embodiment of the present invention.
Figure 8B:
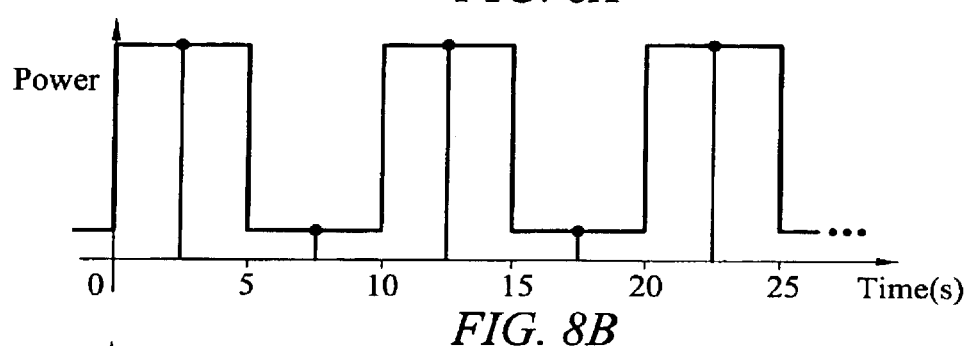
Figure 8C:
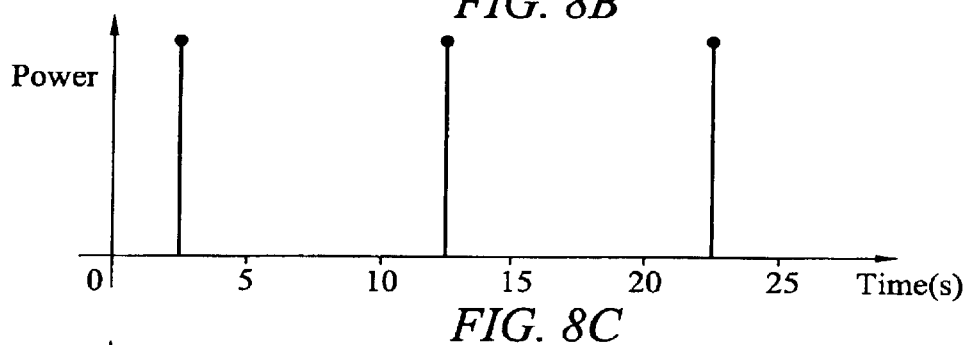
Figure 8D:
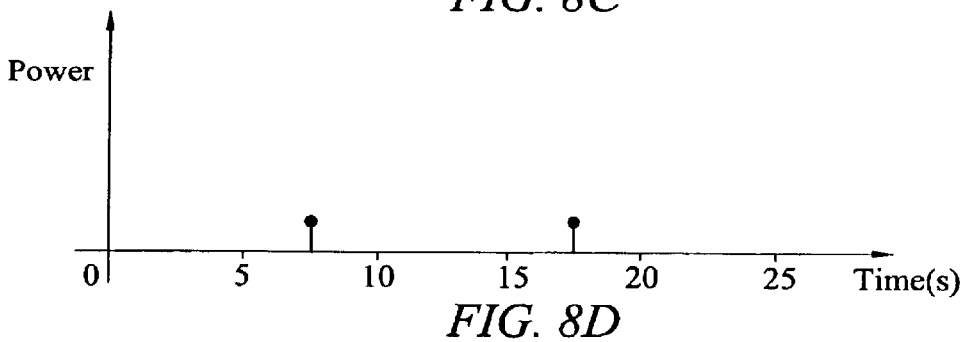
Figure 8E:
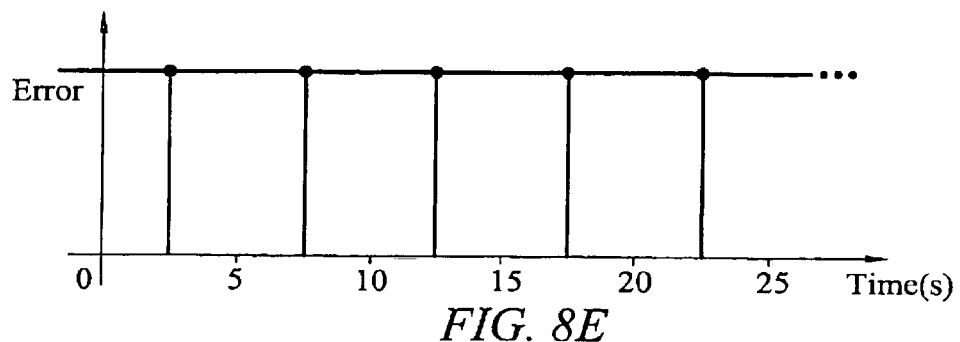

FIG. 8A depicts the laser frequency variation in response to the dithering signal. FIG. 8B depicts the measured power output of fiber Bragg grating 106 with the sampling times of the output of second downsampler 304 marked. FIG. 8C depicts the output of fourth downsampler 308 while FIG. 8D depicts the output of third downsampler 306. The difference between the outputs of the two downsamplers is positive this time as shown in FIG. 8E indicating a positive frequency deviation.

Figure 9:
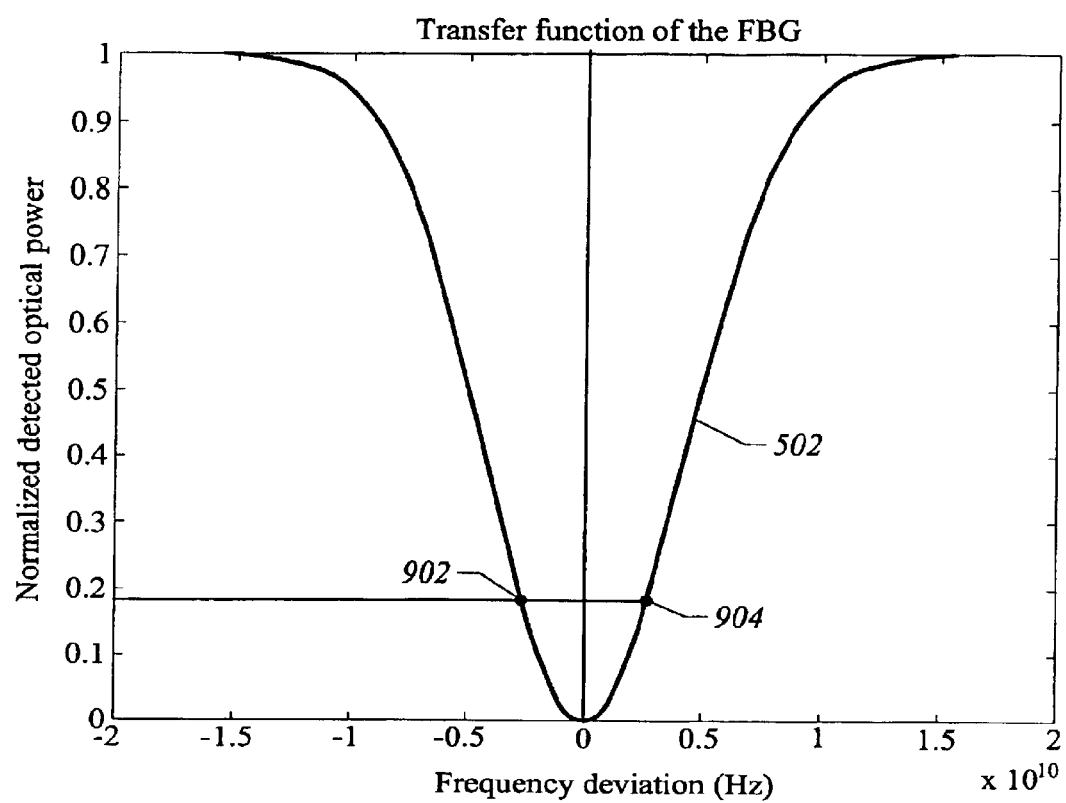
FIG. 9 graphically depicts the relationship between laser output frequency and the frequency response of a fiber Bragg grating where the laser frequency is at a desired value according to one embodiment of the present invention.

FIG. 9 depicts laser frequency variation in relationship to the fiber Bragg grating frequency response when the loop is in lock and the average frequency deviation is zero. A first point 902 corresponds to the "low" phase of the dithering signal while a second point 904 corresponds to the "high" phase of the dithering signal. It can be seen that the average deviation is zero and that the power level is the same for both phases of the dithering signal.

Figure 10A:
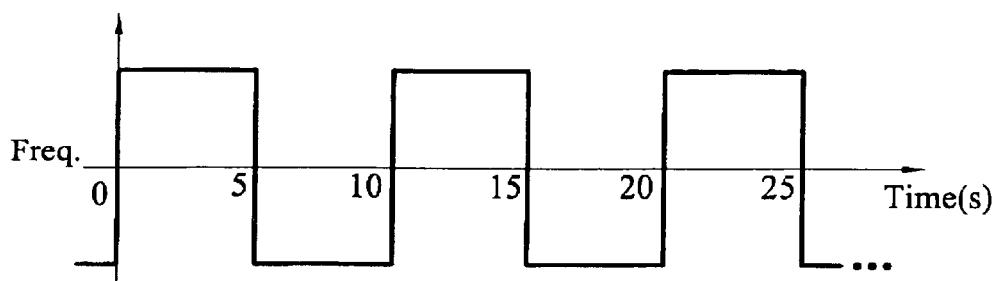
FIGS. 10A–10E depict intermediate signals generated in response to the laser frequency lock condition depicted in FIG. 9 according to one embodiment of the present invention.
Figure 10B:
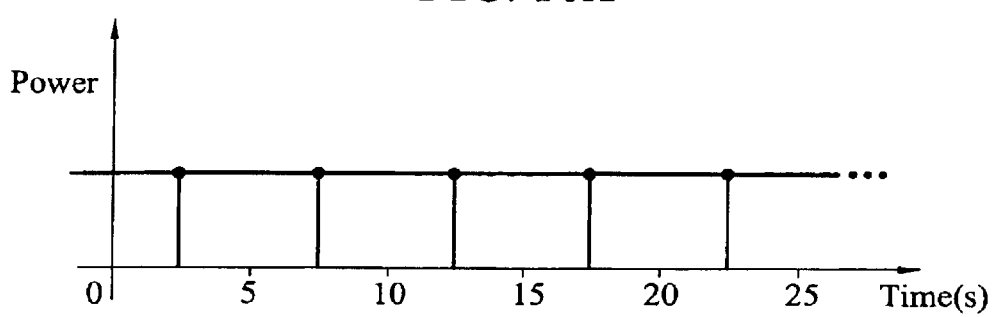
Figure 10C:
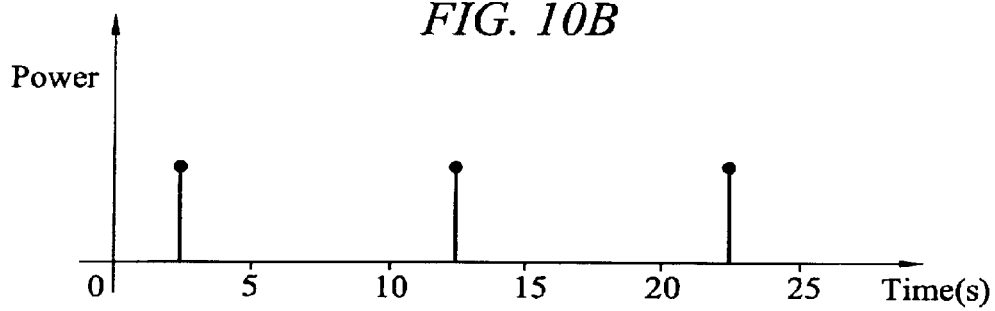
Figure 10D:
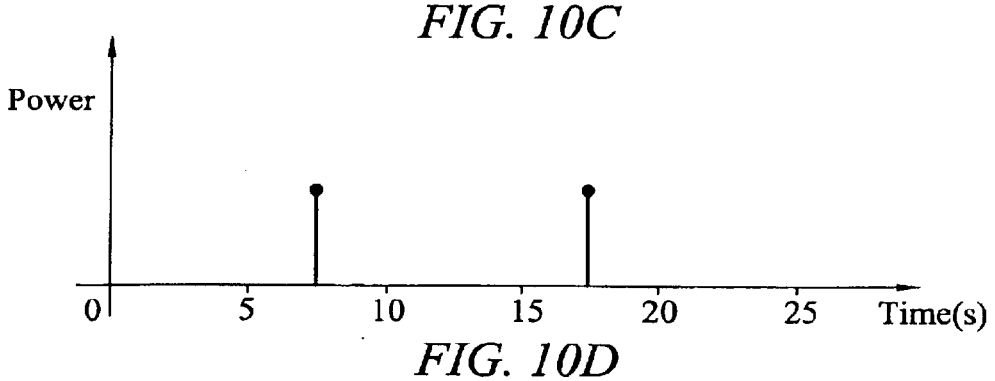
Figure 10E:
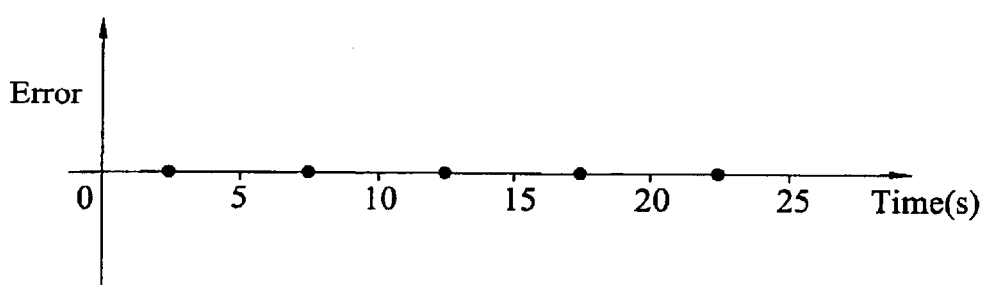

FIG. 10A depicts the modulation of laser frequency due to the influence of the dithering signal. FIG. 10B depicts the power level at the output of fiber Bragg grating 106 with the sampling points marked corresponding to the samples output by second downsampler 304. It can be seen that the samples have equal value. FIG. 10C depicts the samples output by fourth downsampler 308 while FIG. 10D depicts the samples output by third downsampler 306. The differences between the samples output by third down sampler 306 and fourth downsampler 308 are zero as shown in FIG. 10E and this gives rise to a zero output for synchronous detection block 204.

Figure 4:
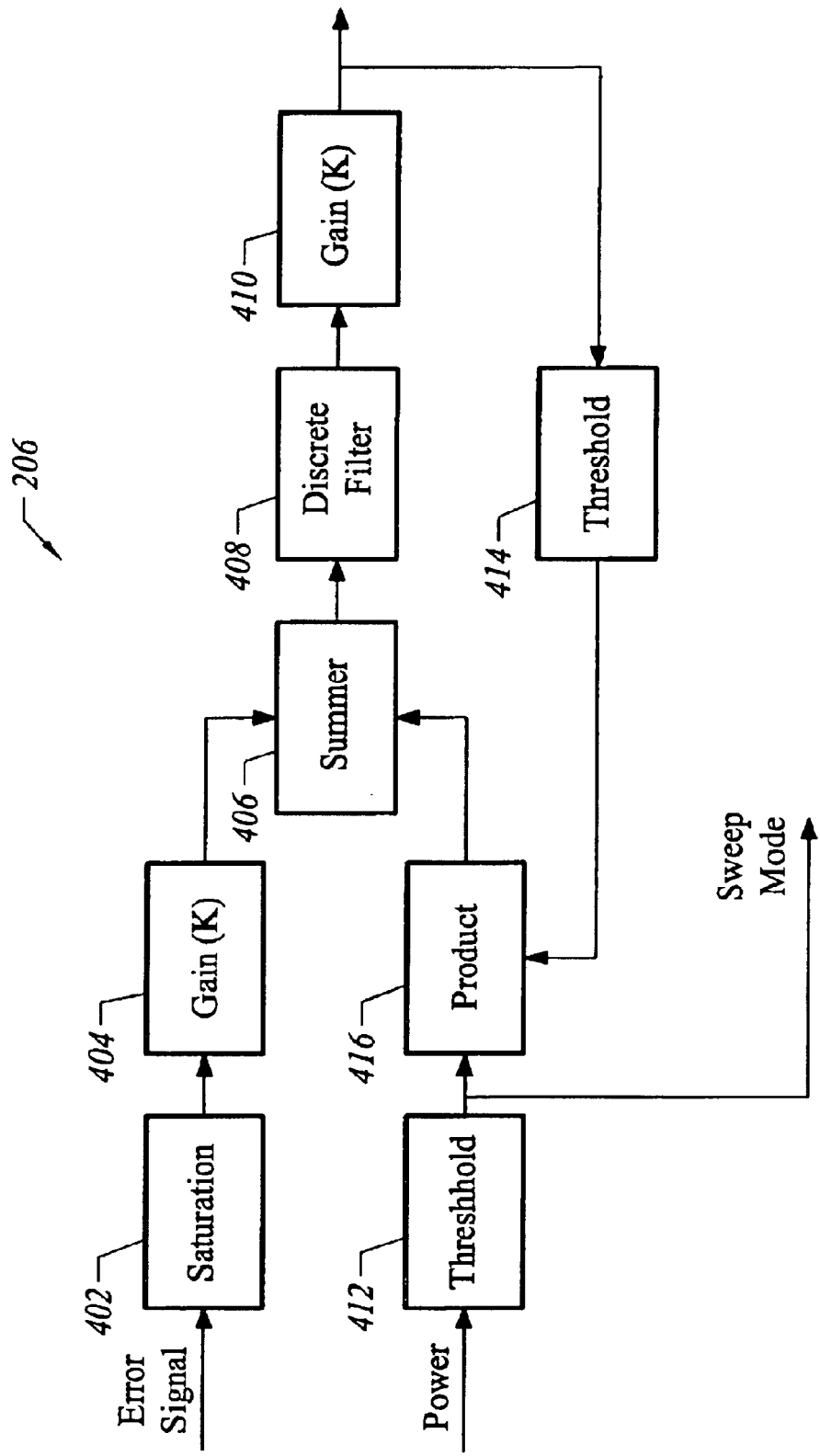
FIG. 4 depicts details of an integrator and loop logic block according to one embodiment of the present invention.

FIG. 4 depicts details of integrator and loop logic block 206 according to one embodiment of the present invention. Block 206 essentially operates in two modes to generate a control signal. In a tracking mode, the error signal generated by synchronous detection block 204 is integrated to form a control signal. In a sweep mode, the control signal is used to sweep the laser frequency back and forth across a range. The sweep mode is employed because once the laser frequency drifts far away from its desired value, the notch filter slope becomes relatively flat and it is therefore difficult to estimate the magnitude and sign of the error. Once the laser frequency sweeps back near the desired frequency, block 206 reenters the tracking mode. The slopes of the notch filter response will determine the delineation in frequency between the sweep mode and the tracking mode. In one embodiment, the threshold used to switch between the sweep mode and tracking mode corresponds to a detected optical power level at the output of fiber Bragg grating 106 that is 0.8 times the maximum power level experienced outside the filter notch.

In operation, the output of synchronous detection block 204 is sent to a saturation block 402. Saturation block 402 imposes a maximum and a minimum error signal value to be used for further processing. These limits correspond to 20% of the maximum possible error signal value. Error signal amplitude is set for proper loop operation by a gain block 404. The error signal is sent to a summer block 406 that sums the processed error signal and a sweep signal that will be generated as described below. The output of summer block 406 is sent to a discrete digital filter 408 that acts as an integrator. In one embodiment, the transfer function of discrete filter 408 is $1/(1-z^{-1})$. Of course, any suitable transfer function may be used. Gain block 410 then adjusts the control signal amplitude prior to input to summer 210.

A threshold block 412 monitors the power signal output by analog to digital converter 202 and outputs a non-zero value when the power rises above a threshold that indicates a large deviation from an ideal laser output frequency. Otherwise, threshold block 412 outputs a zero value. The output of threshold block 412 indicates whether the control loop is in the sweep mode or tracking mode with a non-zero value indicating the sweep mode and a zero value indicating the tracking mode. In one embodiment, the non-zero value is 1. Threshold block 412 may incorporate a degree of hysteresis to avoid oscillation between the sweep mode and tracking mode. A threshold block 414 outputs a negative value once the output of block 410 reaches a positive threshold and outputs a positive value once the output reaches a negative threshold. The positive and negative thresholds represent the width of the sweep and the operation of threshold block 414 causes the sweeping action to switch directions once the limits of the sweep range are reached. Accordingly, threshold block 414 exhibits hysteresis such that the positive threshold is only used for switching to the negative output and vice versa.

A product block 416 multiples together the outputs of threshold block 412 and threshold block 414. It can be seen that in the tracking mode, the zero output of threshold block 412 will force the output of product block 416 to be zero regardless of the output of threshold block 414, thus causing there to be no sweep input to summer 406. During the sweep mode, the output of product block 416 is the positive or negative output of threshold block 414.

It can be seen that the laser frequency control loop described herein offers many advantages. Only a single photodetector and filter need be used. Furthermore, by providing a sweep mode, the control loop continues to operate even when laser frequency deviates sufficiently far from the desired value to approach a flat portion of the filter response.

It is understood that the examples and embodiments that are described herein are for illustrative purposes only and various modifications and changes in light thereof will be suggested to persons skilled in the art and are to be included within the spirit and purview of this application and scope of the appended claims and their full scope of equivalents. For example, an optical component with a bandpass response may replace fiber Bragg grating 106 by interchanging third downsampler 306 and fourth downsampler 308.

What is claimed is:

1. A method for controlling an output frequency of a laser, said method comprising:

passing optical energy from an output of said laser to an optical component having a frequency-selective response characteristic;

measuring response of said optical component having said frequency-selective response characteristic to said optical energy from said laser output using exactly one photodetector; and controlling said laser output frequency based on said measured response by generating an error signal based on a difference between a measured laser output frequency and a desired laser output frequency and generating a control signal for said laser output frequency based on a sum of said error signal and a dithering signal; and if said measured response indicates said laser output frequency is outside a tracking range, sweeping a said control signal until said laser output frequency is within said tracking range.

2. The method of claim 1 wherein generating an error signal comprises:

sampling said measured response at a first sampling time during a period that said dithering signal causes an upward fluctuation in said laser output frequency;

sampling said measured response at a second sampling time during a period that said dithering signal causes a downward fluctuation in said laser output frequency; and developing said error signal based on a difference between samples recorded at said first sampling time and said second sampling time.

3. The method of claim 1 wherein said optical component having a frequency-selective response characteristic comprises a fiber Bragg grating having a notch frequency substantially equivalent to a desired output frequency of said laser.

4. A method for controlling an output frequency of a laser, said method comprising:

passing optical energy from an output of said laser to an optical component having a frequency-selective response characteristic;

measuring response of said optical component having said frequency-selective response characteristic to said optical energy from said laser output;

generating a dithering signal to dither said output frequency of said laser; and controlling said laser output frequency based on said measured response as influenced by said dithering signal; and if said measured response indicates said laser output frequency is outside a tracking range, sweeping a control signal until said laser output frequency is within said tracking range.

5. The method of claim 4 wherein controlling said laser output frequency comprises:

generating an error signal based on a difference between a measured laser output frequency and a desired laser output frequency; and generating a control signal for said laser output frequency based on said error signal and said dithering signal.

6. The method of claim 5 wherein generating an error signal comprises:

sampling said measured response at a first sampling time during a period that said dithering signal causes an upward fluctuation in said laser output frequency;

sampling said measured response at a second sampling time during a period that said dithering signal causes a downward fluctuation in said laser output frequency; and developing said error signal based on a difference between samples recorded at said first sampling time and said second sampling time.

7. The method of claim 4 wherein said optical component having a frequency-selective response characteristic comprises a fiber Bragg grating having a notch frequency substantially equivalent to a desired output frequency of said laser.

8. The method of claim 4 wherein said dithering signal comprises a square wave.

9. Apparatus for controlling an output frequency of a laser, said apparatus comprising:

an optical component having a frequency-selective response characteristic, said optical component receiving optical energy from said laser;

exactly one photodetector that measures response of said optical component having said frequency-selective response characteristic to said optical energy from said laser output;

a control block that controls said laser output frequency based on said measured response, wherein said control block comprises:

an error signal generator that generates an error signal based on a difference between a measured laser output frequency and a desired laser output frequency; and a control signal generator that generates a control signal for said laser output frequency based on said error signal and a dithering signal; and a sweep generator that, if said measured response indicates said laser output frequency is outside a tracking range, sweeps said control signal until said laser output frequency is within a tracking range.

10. The apparatus of claim 9 wherein said error signal generator samples said measured response at a first sampling time during a period that said dithering signal causes an upward fluctuation in said laser output frequency, samples said measured response at a second sampling time during a period that said dithering signal causes a downward fluctuation in said laser output frequency, and develops said error signal based on a difference between samples recorded at said first sampling time and said second sampling time.

11. The apparatus of claim 9 wherein said optical component having a frequency-selective response characteristic comprises a fiber Bragg grating having a notch frequency substantially equivalent to a desired output frequency of said laser.

12. Apparatus for controlling an output frequency of a laser, said apparatus comprising:
   an optical component having a frequency-selective response characteristic that receives optical energy from said laser;
   a photodetector that measures response of said optical component having said frequency-selective response characteristic to said optical energy from said laser;
   a dithering signal generator that dithers said output frequency of said laser; and
   a control block that controls said laser output frequency based on said measured response as influenced by said dithering signal; and
   a sweep generator that, if said measured response indicates said laser output frequency is outside a tracking range, sweeps a control signal until said laser output frequency is within said tracking range.

13. The apparatus of claim 12 wherein said control block comprises:
   an error signal generator that generates an error signal based on a difference between a measured laser output frequency and a desired laser output frequency; and
   a control signal generator that generates a control signal for said laser output frequency based on said error signal and said dithering signal.

14. The apparatus of claim 13 wherein said error signal generator samples said measured response at a first sampling time during a period that said dithering signal causes an upward fluctuation in said laser output frequency, samples said measured response at a second sampling time during a period that said dithering signal causes a downward fluctuation in said laser output frequency, and develops said error signal based on a difference between samples recorded at said first sampling time and said second sampling time.

15. The apparatus of claim 12 wherein said optical component having a frequency-selective response characteristic comprises a fiber Bragg grating having a notch frequency substantially equivalent to a desired output frequency of said laser.

16. The method of claim 12 wherein said dithering signal comprises a square wave.

17. Apparatus for controlling an output frequency of a laser, said apparatus comprising:
   means for passing optical energy from an output of said laser to an optical component having a frequency-selective response characteristic;
   means for measuring response of said optical component having said frequency-selective response characteristic to said optical energy from said laser output using exactly one photodetector;
   means for controlling said laser output frequency based on said measured response by generating an error signal based on a difference between a measured laser output frequency and a desired laser output frequency generating a control signal for said laser output frequency based on a sum of said error signal and a dithering signal; and
   means for, if said measured response indicates said laser output frequency is outside a tracking range, sweeping said control signal until said laser output frequency is within said tracking range.

18. The apparatus of claim 17 wherein said means for generating an error signal comprises:
   means for sampling said measured response at a first sampling time during a period that said dithering signal causes an upward fluctuation in said laser output frequency;
   means for sampling said measured response at a second sampling time during a period that said dithering signal causes a downward fluctuation in said laser output frequency; and
   means for developing said error signal based on a difference between samples recorded at said first sampling time and said second sampling time.

19. The apparatus of claim 17 wherein said optical component having a frequency-selective response characteristic comprises a fiber Bragg grating having a notch frequency substantially equivalent to a desired output frequency of said laser.

20. Apparatus for controlling an output frequency of a laser, said apparatus comprising:
   means for passing optical energy from an output of said laser to an optical component having a frequency-selective response characteristic;
   means for measuring response of said optical component having said frequency-selective response characteristic to said optical energy from said laser output;
   means for generating a dithering signal to dither said output frequency of said laser;
   means for controlling said laser output frequency based on said measured response as influenced by said dithering signal; and
   means for, if said measured response indicates said laser output frequency is outside a tracking range, sweeping a control signal until said laser output frequency is within said tracking range.

21. The apparatus of claim 20 wherein said means for controlling said laser output frequency comprises:
   means for generating an error signal based on a difference between a measured laser output frequency and a desired laser output frequency; and
   means for generating a control signal for said laser output frequency based on said error signal and said dithering signal.

22. The apparatus of claim 21 wherein said means for generating an error signal comprises:
   means for sampling said measured response at a first sampling time during a period that said dithering signal causes a downward fluctuation in said laser output frequency; and
   means for developing said error signal based on a difference between samples recorded at said first sampling time and said second sampling time.

23. The apparatus of claim 20 wherein said optical component having a frequency-selective response characteristic comprises a fiber Bragg grating having a notch frequency substantially equivalent to a desired output frequency of said laser.

24. The apparatus of claim 20 wherein said dithering signal comprises a square wave.

* * * * *